United States Patent

Kraus

[11] 4,380,212
[45] Apr. 19, 1983

[54] ARRANGEMENT FOR UNIFORMLY COATING SURFACES OF REVOLUTION BY VAPOR DEPOSITION IN A HIGH VACUUM

[75] Inventor: Thaddäus Kraus, Triesen, Austria

[73] Assignee: Balzers Aktiengesellschaft, Liechtenstein

[21] Appl. No.: 299,061

[22] Filed: Sep. 3, 1981

[30] Foreign Application Priority Data

Sep. 26, 1980 [CH] Switzerland .................. 7216/80

[51] Int. Cl.³ .............................................. C23C 13/08
[52] U.S. Cl. ................................... 118/720; 118/730; 118/726; 118/504; 427/255.5
[58] Field of Search ............... 118/500, 504, 720, 721, 118/722, 730, 726, 729; 427/255.5, 251

[56] References Cited

U.S. PATENT DOCUMENTS

3,530,824  9/1970  Illsley et al. ................ 118/720
3,636,916  1/1972  Thelen et al. .............. 118/730 X
4,222,345  9/1980  Bergfelt et al. ............ 118/730 X
4,241,698 12/1980  Vitale ............................ 118/730

Primary Examiner—John D. Smith
Assistant Examiner—Bernard F. Plantz
Attorney, Agent, or Firm—McGlew and Tuttle

[57] ABSTRACT

Surfaces of revolution to be coated by vapor deposition are placed in centering holes of a rotary dome which is centrally seated on a rotary ring. The rotary ring centered by means of fixedly mounted guide and drive rollers so as to have an evaporative source located as close as possible to the axis of rotation of the dome and at the center of curvature of the dome. The substance, vaporized by heating in a high vacuum space, condenses on the substrates as a thin layer. From the variation of the layer thickness, the outline of a corrective mask is computed for a constant radiant intensity of the vapor in all utilizable directions in the space, while assuming a central, point source of evaporation. A corresponding corrective mask is then secured by means of a support to another rotary ring in close proximity to the surfaces of revolution to be coated, which other ring is centered in the same manner as the first rotary ring, but rotates in the opposite direction about the same axis. Under otherwise equal conditions and in spite of a deviation from ideal conditions, this results in a uniform coating of high precision, that is, in an equal layer thickness at all points of the surfaces of revolution which are equally spaced from the center of the surface.

17 Claims, 9 Drawing Figures

ARRANGEMENT FOR UNIFORMLY COATING SURFACES OF REVOLUTION BY VAPOR DEPOSITION IN A HIGH VACUUM

FIELD AND BACKGROUND OF THE INVENTION

The present invention relates in general to vapor deposition techniques for coating substrates, and in particular to a new and useful arrangement for uniformly coating surfaces of revolution by vapor deposition in a high vacuum which optimizes various conditions and parameters.

A deposition of substrates by evaporation in a high vacuum is particularly suited for exactly coating spherical or planar surfaces, such as optical lenses, mirrors, and filters, because of the high precision of this process. In the industrial coating of substrates, however, what matters is not only the obtaining of a precise layer thickness, but also low manufacturing costs. For this reason, it is sought to place as many substrates as possible in the vapor beam cone, while making allowances for differences in the layer thickness which occur between both the various locations of the same substrate and identical corresponding locations of different substrates. To reduce these differences to a tolerable degree is a recurrent task.

Figure 1:
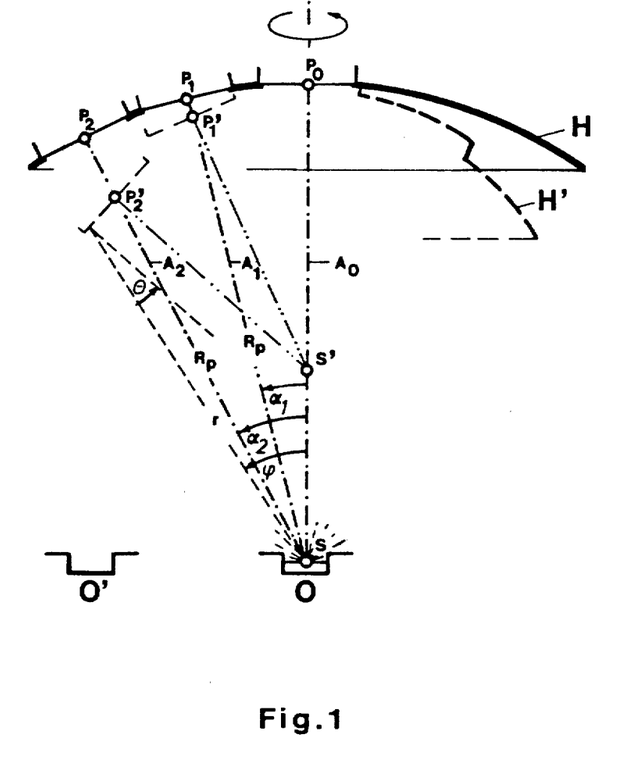
FIG. 1 is a schematic diagrammatical and explanatory illustration showing parts of various arrangements for vapor depositing a coating on a substrate, and parameters to be used in accordance with the invention.

The simplest way of reducing these differences is, as shown in FIG. 1, to place the substrates in centering holes of a spherically domed plate H, also termed a "dome", so that all the substrate poles $P_0$, $P_1$, etc. are equidistantly spaced from the common point of intersection S of the substrate axes $A_0$, $A_1$, $A_2$, etc. The dome is then rotated in the high-vacuum container about a vertical axis $A_0$ passing through the pole and the center of curvature of the dome.

In this application the term "substrate pole" is used to mean the center of the surface to be coated (a point); and "substrate axis" is used to mean the normal set up at the substrate pole (that is a line which is normal to the plane containing the substrate pole).

Figure 2A:
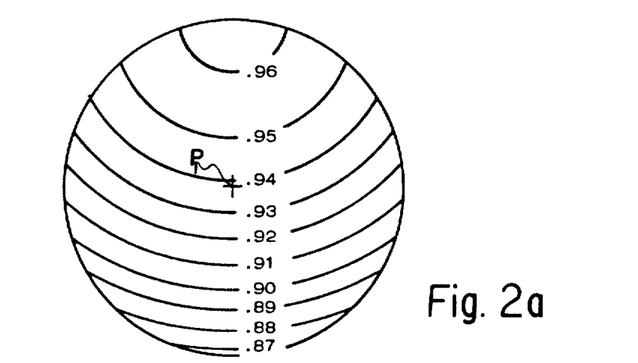
FIGS. 2a, 2b and 2c are top plan views with contour lines showing lines of even thickness of coating on various substrates used in accordance with prior art techniques and the invention.

If the vapor source O, for example a tantalum plate "dish" filled with magnesium fluoride and heated with electric current, is placed at the point of intersection S of the substrate axes, the substance evaporating in the high vacuum condenses on the substrates as a thin layer having a considerably varying thickness, due to influencing factors, such as the angle of emission $\phi$, distance r, and angle of incidence $\theta$, which vary from point to point. On the planar substrate shown by way of example in FIG. 1, in full scale, the layer thickness of an outer substrates at its outer edge, correspond to only about 87%, and that at its inner edge to about 96% of the layer thickness at pole $P_0$ for the center substrate. This coating is illustrated for substrate wich pole $P_1$, in FIG. 2a in the form of an isogram by means of lines of equal level, or isolines, with the numbers indicating the proportion of the thickness at the respective locations, to the layer thickness at pole $P_0$. A substrate in the position $P_2$ is affected with greater deviation.

The systematic deviations decrease if, with the evaporative source still remaining at the point of intersection of the substrate axes, the angle $\alpha_1$, formed between the substrate axis $A_1$ and the axis of rotation $A_0$ is reduced and the distance $R_p$ from the evaporative source O is increased. This, however, is uneconomical because of the unsatisfactory utilization of the vapor beam cone and too high a manufacturing cost. On the other hand, it is frequently provided to place the evaporative source at such a distance from the axis of rotation $A_0$, at which the systematic deviations are minimized, for example at a point $O'$ in FIG. 1. What then remains in most instances are undesirable systematic deviations. What is particularly disturbing is the coating asymmetry of substrates which are placed at a larger distance from the evaporative source.

Figure 2B:
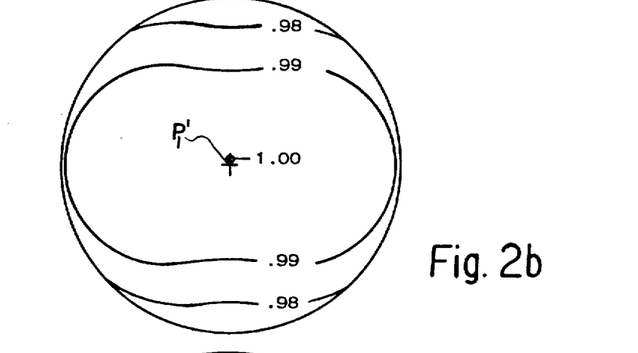

A higher degree of symmetry may be obtained, however, if, in accordance with the well known rules of a two-dimensional parameter optimization and starting from the position $P_1$, the distance of the substrate pole from the evaporative source is reduced and at the same time, the distance of the point of intersection of the substrate axes with the axis of rotation from the evaporative source is increased, until finally the layer thickness at the substrate pole $P'_1$ is equal to that at the pole $P_0$ and becomes the center of a single isoline. By way of example, the isoline obtained on a planar substrate placed in the optimum position $P'_1$ are shown in FIG. 2b. Since the substrate $P'_1$, $P'_2$, etc. are no longer equidistantly spaced from the point of intersection of the substrate axes, supports $H'$, in the shape of stepped spherical zones, are needed which must each be brought into correspondence with the position of the evaporative source and with the basic radius of curvature of the substrates, whereby high manufacturing costs are incurred. Moreover, the unequal coating of substrates rotating in different circular paths is frequently troublesome.

If, on the other hand, circular isolines are desired having their center at the substrate pole and which, strictly speaking, in the arrangement hitherto discussed, can be obtained but with the substrate in its position $P_0$, a rotation of each of the substrates about its own axis is provided, with the coatings of substrates rotating in addition in a common circular path also remaining always equal to each other. This, however, requires planetary gears or other rotary gearings which are expensive in manufacture and not without problems in operation under the conditions of vapor deposition. Since the vapor beam cone is only unsatisfactorily utilized by substrates involving in a single circular path, the manufacturing costs are very high.

These coatings however, have the particular property of being equal to each other and being representable by circular isolines having their center at the substrate pole. In the following, this property will be termed "uniformity". Even though this uniformity is only seldom desired, it is frequently obtained. If however, "evenness" is sought, that is a uniform layer thickness, this cannot be thoroughly attained with the above described arrangement which may be supplemented by additional circular paths, adjusting devices, masks or further axes of rotation. A distinction is here to be made between "evenness" that is equality in dimension or thickness and "uniformity" that is equality in shape.

SUMMARY OF THE INVENTION

An object of the invention is to overcome the problem that, under the hitherto producible conditions, a uniformity of coating cannot be obtained with a satisfactory precision nor with a satisfactory economy. Another objective, alter all the conditions so that uniform coatings can be produced both with the highest precision and with least expenditure of work and auxiliary means.

A further object of the invention is to provide an arrangement for uniformly coating a number of surfaces of revolution by vapor deposition in a high vacuum container by means of at least one evaporative source, comprising a structure for supporting all the substrates to be coated which is rotatable about a fixed axis, and at least one corrective mask for intercepting at least part of a vapor stream emitted from the evaporative source, and which also is rotatable about a fixed axis, the arrangement having the following features:

(a) all the substrate axes ($A_1$, $A_2$) intersect at a single point (S);

(b) all the substrate poles ($P_1$, $P_2$) are equidistantly spaced from the point of intersection (S) of the substrate axes;

(c) the axis of rotation ($A_0$) of the structure supporting the substrates passes through the point of intersection (S) of the substrate axes;

(d) the axis of rotation of the at least one corrective mask coincides with the axis of rotation ($A_0$) of the structure supporting the substrates, which structure rotates in opposite direction;

(e) the distance between the evaporative source and the point of intersection (S) of the substrate axes corresponds to less than 15% of the distance between the point of intersection (S) of the substrate axes and the substrate poles ($P_1$, $P_2$);

(f) the distance between the corrective mask and the substrates corresponds to less than 15% of the distance ($R_P$) between the point of intersection (S) of the substrate axes and the substrate poles ($P_1$, $P_2$); and (g) the contour of the at least one corrective mask is determined empirically from the distribution of the vapor radiation in the container to the effect that on a spherical surface on which all the substrate poles are located, an even coating is produced.

Another object of the invention is to provide such an arrangement wherein the at least one corrective mask has a contour which has been determined by an aperture angle $\omega$ and the polar distance $\phi$ of a radius vector L extending from the point of intersection (S) of the substrate axes and skirting the outline of the maks, wherein the production of a numerical value of the aperture angle $\omega$ and the numerical value of the radiant intensity $I_0$ which, with the mask omitted, is available from the evaporative source and depends on the polar distance $\phi$, does not vary within the utilized interval of $\phi$, so that the relation $[\omega]_\phi \cdot [I_0]_\phi$ is satisfied.

The solution consists in the selection of a certain combination of qualitive factors, such as evaporative source, rotary substrate support, rotary corrective mask, and of quantitive factors, such as position of the evaporative source and the substrates, of the corrective mask, of the axis of rotation, and contour of the collective mask. Partial combinations of these factors have been provided and employed. However, they have not been satisfactory since even with a single one of the factors left out, a uniformity of coating is no longer insured. For example, no uniformity of coating of surfaces of revolution can be obtained if the evaporative source is positioned at a (sub)optimal position O', or the substrates are positioned at the (sub)optimal locations $P'_1$ or $P'_2$ in FIG. 1, not even if other parameters of adjustment are included in the optimization. That is, while solving a multidimensional optimization problem, a change of a single factor requires a quite new adjustment of all the other factors.

The coating of substrates in accordance with the foregoing teaching, is marked not only by high precision but also by particularly low expenditures of material and work for manufacturing the auxiliary means. The application of this teaching is thus not limited to special purposes expressly required in a uniformity of coating, but covers even cases in which conflicting requirements of a maximum evenness and minimum manufacturing costs is decided in favor of the cost factor. A further object of the invention is to provide an arrangement which is simple in design, rugged in construction and economical to manufacture, which achieves the purpose of the invention and produces a uniform and/or substantially even coating on substrates to be coated.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 3A:
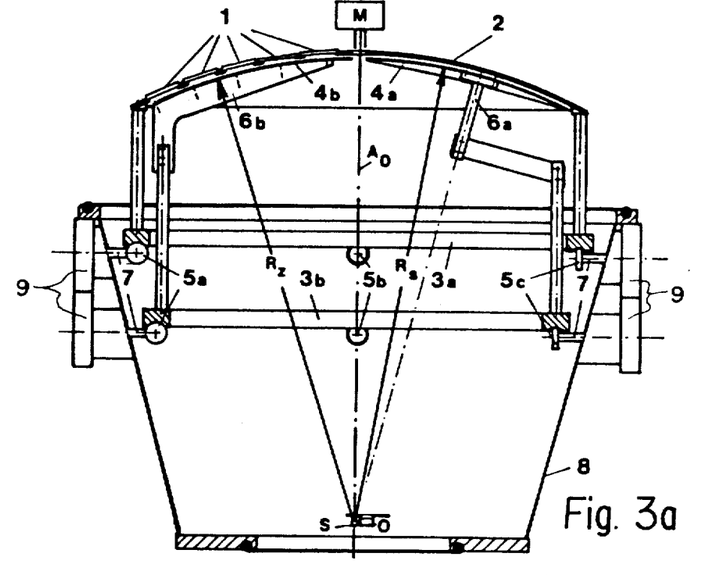
FIG. 3a is a side sectional view of an arrangement according to the invention.
Figure 3B:
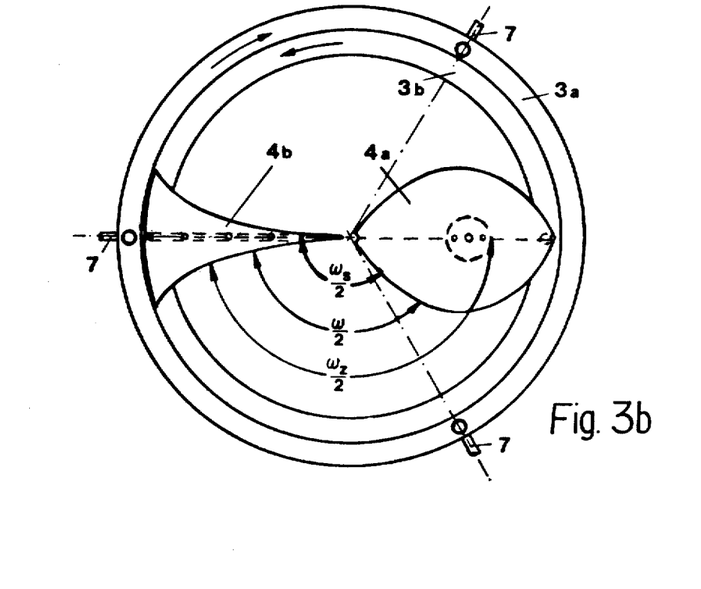
FIG. 3b is a top plan view of part of the arrangement shown in FIG. 3a which illustrates exemplary shapes of the corrective masks used in accordance with the invention.

Turning to the drawings in particular, the invention embodied therein, in FIGS. 3a and 3b, comprise an arrangement for the vepor deposition, in a vacuum, of material from an evaporative source O, onto the surface of substrates 1 to be coated.

If circular substrates 1 are placed in centering holes of dome 2, substrate positions are necessarily obtained which satisfy the conditions or features (a) and (b) of above, with an accuracy corresponding to the dimensional stability of the device or arrangement. For annular substrates, suitable round mounts are needed. Substrate mounts, however, may also be attached to each other to form a dome, or secured between concentrically arranged rings which are supported on meridional ribs.

The mentioned dome 2 is centrically seated on a rotary ring 3a whose axis or rotation $A_0$ passes through the center of curvature S of the dome and satisfies the condition (c). An aperture at the center of the dome provides space for a sensor M used for controlling the coating operation overall. The axis of the rotary ring 3a, coincides with the axis of a second rotary ring 3b intended for securing corrective masks 4a and 4b, which satisfies the condition (d). The dome and corrective masks rotate in opposite directions.

The rotary rings 3a and 3b for supporting substrates and masks respectively are each carried by three guide and driver rollers 5a, 5b and 5c mounted to a fixed frame of support, with their axes of rotation intersecting at a point on axis of rotation $A_0$. To ensure a quiet run for precise coatings, care is to be taken to provide the rotary rings 3a and 3b with an underside guide groove into which each of the two amply rounded (ball) rollers 5a and 5b are snugly engaged. The third roller 5c, which is narrower, contacts the groove at a single point. This provides for an automatic centering of the rotary ring.

The shafts 7 of the guide and drive rollers may extend through the wall of a hopper-like portion 8 of the high-vacuum container, which acts as a support for the roller shafts as shown in FIG. 3, which can be lifted or lowered, and laterally swung out, so that the substrates, corrective mask and evaporative source are easily accessible. The rollers may be driven by one or more of the units 9.

In the embodiment of the FIGS. 3a and 3b, the evaporative source 0 is provided close to the center of curvature S of the dome and satisfies the condition (e).

Figure 4A:
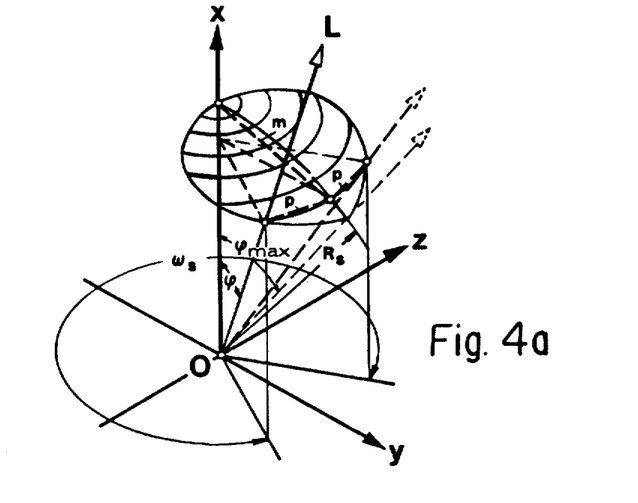
FIG. 4a is a perspective explanatory illustration of an exemplary corrective mask for coarse adjustment of the amount of material permitted to reach the substrates from an evaporative source.
Figure 4B:
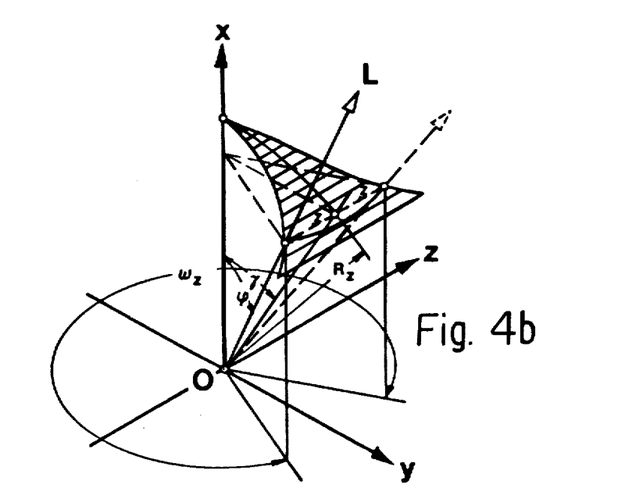
FIG. 4b is a view similar to FIG. 4a showing a corrective mask for fine adjustment.

FIGS. 3a and 3b further illustrate that the condition (f) is satisfied, since the corrective masks of which one 4a is spherically convex and the other 4b cylindrical, are positioned in close proximity to dome 2. As shown in FIGS. 4a and 4b, the mask for fine adjustment labelled 4b has the shape or contour of a triangle with one angle near axis $A_0$ and two adjacent concave sides joined to a convex base opposite axis $A_0$. Course adjustment mask 4a is almond shaped with one angle near the axis $A_0$ and an opposite angle near a periphery of dome 2. The corrective masks cannot be defined as geometric figures which would ensure a uniform coating of the substrate with any evaporative source, since the directional radiant intensity may vary from one evaporative source to another.

With regard to the radiant intensity of an evaporative source, generally the ratio of vapor amount to the solid angle is a characteristic of the vapor emission from a specific evaporative source in a specific direction during the coating, and is termed, within the context of this application (borrowing the term from photometry) "radiant intensity".

To obtain numerical values proportional to the radiant intensity from a coating of substrates effected in a single operation, the following initial conditions may be assumed:

let the thickness s of the coating be directly proportional to the intensity of the substrate irradiation (particle flow per unit surface of the substrate);

let the intensity of the irradiation be directly proportional to the direction cosine, cos $\theta$, of the incident vapor beam (by analogy to the first Lambert's law);

let the intensity of irradiation be inversely proportional to the square of the distance r between the surface and the evaporative source (by analogy to the square law of distances in photometry); and finally let the intensity of irradiation also be directly proportional to the radiant intensity of the evaporative source in the spacial direction given by the surface point of the coating.

To plot the radiant intensity of an evaporative source as a function of the direction, the layer thickness s, the distance r from the evaporative source, the direction cosine, cos $\theta$, of the incident vapor beam, and the direction cosine, cos $\phi$, of the emitted vapor beam are measured from a plurality of substrate points, and the quotient s·$r^2$/cos $\theta$ is formed which is proportional to the radiant intensity of the evaporative source, and plotted as a function of the cos $\phi$.

However, for substrates arranged to satisfy the conditions (a), (b), (c), and (d), and having their axes at different angles to the axis of rotation, it is true, with a satisfactory accuracy, that cos $\theta = 1$; r=const.; and $\phi = \alpha$. Thus, the layer of thickness of the substrate poles may be considered proportional to the radiant intensity and can directly be plotted in a coordinate scheme as a function of cos $\alpha$.

Turning now to the method of obtaining the correct corrective mask shapes, according to condition (g), a uniform coating always requires such a contour of the corrective mask with which an even coating is produced on a spherical surface on which all of the substrate poles are located. The optimum contour of the corrective mask may be formed faster by a method of sequential searching than by a haphazard hunting operation. However, these searching methods are complicated and rendered still more difficult by unavoidable random deviations which become disturbingly manifest in a comparable magnitude, in addition to systematic deviations, and which are due to random fluctuations of the radiant intensity of the evaporative source in different special directions, as well as to measuring errors.

Nevertheless under the conditions (a), (b), (c), (d), and (e) set forth above, the contour of the corrective mask can also be specified clearly and in a particularly simple way as explained in the following with reference to FIGS. 4a and 4b. If a spherical polar coordinate system is constructed at the point of intersection S of the substrate axes, having its X axis coincident with the axis of rotation $A_0$, the contour of the corrective mask can be described by moving a radius vector extending from the original O of the coordinate system and skirting the perimeter of the corrective mask. During a single complete run of radius vector L around the mask, the angle $\phi$ formed between the vector and the X axis assumes two identical numerical values at every two associated points of the perimeter (the breaks at the ends being neglected). At these two points, the projections of the radius vector on the Z-Y plane perpendicular to the Z axis form the sides of an angle having its vertex on the X axis. The exterior is called the aperture angle.

With the condition (g) satisfied, aperture angle $\omega$ assumes certain numerical values for each of the values of angle $\phi$. To compute these numerical values, empirical numerical values of the radiant intensity $I_0$ of the respective evaporative source in directions defined by the various values of $\phi$, and obtained with the omission of the mask, must be available. They may be determined experimentally in the following simple way.

Under the conditions (a), (b), (c) and (e), the radiant intensity $I_0$ is with a satisfactory accuracy, always directly proportional to the layer thickness at the poles of the substrates whose axes form different angles $\alpha$ with the axis of rotation $A_0$. It is therefore best practice to coat planar substrates in different positions $P_1$, $P_2$ etc. in a single operation, while omitting the mask but otherwise under identical conditions, to measure the layer thickness in the substrate poles as well as the angle $\alpha = \phi$ formed by the substrate axis $A_1$, $A_2$ etc. and the axis of rotation $A_0$, and finally to plot the measured values of layer thickness which are proportional to the radiant intensity, in an orthogonal logarithmic coordinate scheme as a function of the direction cosine, $\cos \phi$. The measured points then mostly substantially lie on a straight line having a slope determined by a so-called emission exponent $k = d \log I_0/d \log \cos \phi$. As a rule the numerical values of k are greater than 1.

Since the distribution of the radiant intensity may vary not only from one evaporative source to the other, but also from one vapor deposition to the next one, it is advisable to take average values of a plurality of measurements of substrates which are arranged with a sufficiently small spacing over the utilizable interval of $\phi$.

The graphical representation shows, for any numerical value $[\phi]$, a numerical value $[I]_\phi$, which is proportional to the radiant intensity and wherefrom a definite numerical value $[\omega]$ of the aperture angle can be computed. This angle can be computed, in accordance with the invention, wherein the product of a numerical value of the aperture angle $\omega$ and a numerical value of the radiant energy $I_0$ which, with the mask omitted, is available from the evaporative source and depends on the polar distance $\phi$, does not vary within the utilized interval of $\phi$, so that the relation $[\omega]_\phi \cdot [I_0]_\phi$ equals a constant is satisfied. As high as possible an arbitrary constant $[\omega] \cdot [I_0]_\phi$ is chosen to avoid unnecessary losses of material energy and time during the evaporation, for example, the product of the minimum radiant intensity $I_{min}$, and, the maximum aperture angle $\omega_{max}$ within the utilizable interval of $\phi$.

It is advantageous but not absolutely necessary to design the corrective mask as symmetrical relative to a meridional plane, so that one half the aperture angle $|\omega|$ is laid off to either side of the trace of the plane of symmetry XY as shown in FIGS. 3a, 3b, 4a and 4b. On any surface, the numerical values of $\pm \omega/2$, which are a function of $\phi$ describe, the contour of a corrective mask with which the uniformity of coating is obtained, provided, of course, that all of the conditions of the invention are satisfied. Condition (f) can best be satisfied by cutting the mask from a spherical plate or sheet, and positioning the center of curvature of the mask at the point of intersection S of the substrate axes.

To construct the outline on a spherical surface, the chords $m = R_s \sqrt{2(1 - \cos \phi)}$ and $p = 2R_s \sqrt{1 - \cos^2 \phi \cdot \cos \omega/4}$ shown in FIG. 4a, are more suitable than the spherical coordinates $\phi$, $\omega$. First, the pole on the axis of rotation and the meridion of the plane of symmetry XY are marked on the spherical plate having a basic radius of curvature $R_s$. Thereupon, with compass adjusted to an opening corresponding to chord m, a so-called parallel circle is described about the pole. The opening of the compass is then adjusted to chord P and arcs are described about the point of intersection of the parallel circle at the meridional plane of symmetry, intersecting the parallel circle at two points which serve as basic points for constructing the mask outline.

By means of a cylindrical rod 6a (FIG. 3a), the spherical corrective mask 4a, is secured to rotary ring 3b so as to make the center of curvature coincide with the point of intersection S of the substrate axes.

As compared to a forming of spherical correcting masks which is relatively expensive, cylindrical correcting masks may anytime be formed from flexible sheet metal easily.

To construct the outline of a cylindrical corrective maks 4b, having a predetermined bending radius $R_z$ (see FIG. 4b), an orthogonal coordinate system is drawn on a plane sheet through the point of intersection with the axis of rotation. By coordinate transformation, the abcissa number corresponding to the arc length $\gamma$ in the plane of symmetry XY:

$$R_Z \cdot \gamma = R_Z \cdot \arctan(\tan \phi \cdot \cos \omega/2)$$

and the ordinate corresponding to the distance from the plane of symmetry XY:

$$Z = \pm R_Z \cdot \tan \omega/2 \cdot \sin \gamma$$

for either of the basic points of the outline, are determined and marked.

The cylindrical corrective mask is screwed to a circular-arc rib 6b (FIG. 3a) determining the curvature radius $R_Z$ of the mask and secured to rotary ring 3b in such a position that the cylinder axis Z and the axis rotation $A_0$ intersect perpendicularly at the point of intersection S of the substrate axis.

Occasionally, however, the advantage of easy forming is opposed by the disadvantage that at some locations, the cylindrical correcting mask is too widely spaced from the dome wherefore the correction is no longer satisfactory, primarily if substantial deviations are to be corrected, and if the distance between the evaporative source and the point of intersection of the substrate axis is large.

It is therefore advisable, as shown in FIGS. 3a and 3b, to secure a cylindrical and a spherical corrective mask in opposite positions to a rotary ring 3b and to rotate them in synchronism. That is, as soon as the main part of the corrective function is performed by the (broader) spherical mask, the small corrections, which are frequent, can be made by means of the narrower cylindrical mask, without affecting the precision.

The two corrective masks are easy to design if the contour of the spherical course-correction mask is explicitely defined by a formula. Particularly suitable are definitions using the relation of angles $\phi$ and $\omega_s$:

$$\omega_s = 2\pi \cdot \frac{\cos\phi_{max}}{\cos\phi}^k$$

or the formula relating to chords m and p:

$$p = 2m \cdot \sqrt{1 - (m^2/4R_s^2)} \cdot \cos\left[\frac{\pi}{2} \cdot \left(\frac{\cos\phi_{max}}{1 - (m^2/2R_s^2)}\right)^k\right]$$

In both formulas $\phi_{max}$ equals the upper limit of the utilizable interval of $\phi$ and k equals the already mentioned emission exponent.

A correct adjustment to the empiric numerical value of k is not necessary however, and even not advisable, in order to prevent the cylindrical fine-correction mask from becoming too narrow and fragile.

To obtain a quick adjustment to various evaporative sources, it is a good practice to have in store a set of spherical masks for course correction which are coursely stepped, but finished with great precision, for example for exponents k=1,2,3,4. Then, in a specific case, the mask is selected which is nearest to the empirically determined emission exponent.

To manufacture the cylindrical mask for fine correction, the radiant intensity $I_0$ is determined as explained in the foregoing, while omitting the two masks, and plotted as a function of the direction cosine, $\cos\phi$, then, in accordance with the teaching that the product of a numerical value of the aperture angle $\omega$ and a numerical value of the radiant intensity which comes from the evaporative source without the presence of a mask, depends on the polar distance $\phi$, and does not vary within the utilized interval of $\phi$, so that the relation $[\omega]_\phi \cdot [I_0]_\phi$ equals a constant, is satisfied. First the aperture angle between the two masks is determined for every numerical value of the radiant intensity $I_0$, and the aperture angle of the cylindrical, fine correction mask is computed therefrom in accordance with the formula (see FIG. 3b):

$$\omega_Z = 2\pi + \omega - \omega_s.$$

If the aperture angle $\omega_s$ of the spherical coarse-correction mask has been defined by the above formulas $W_Z$ is obtained from the radiant intensity $I_0$ measured without the two masks as follows:

$$\omega_Z = 2\pi \cdot \left[ 1 + \frac{I_{min}}{I_0} - \left( \frac{\cos\phi_{max}}{\cos\phi} \right)^k \right],$$

with $I_{min}$ being the minimum value of the radiant intensity within the utilizable interval of $\phi$.

If, on the other hand, the radiant intensity $I_0$ is measured while using the spherical, course-correction mask, but without the cylindrical mask for fine correction, aperture angle $\omega_Z$ of the cylindrical fine-correction mask is computed from the the formula $$\omega_Z = 2\pi \cdot \left[ 1 - \frac{I_s - I_{min}}{I_s} \cdot \left( \frac{\cos\phi_{max}}{\cos\phi} \right)^k \right].$$

For transforming the coordinates $\phi, \omega_Z$ into coordinates $R_{Z,\gamma}$, Z, the formulas already given above are to be applied.

Plane corrective masks may also be employed, of course, only the mentioned disadvantage of cylindrical masks then become more pronounced.

The technological success of the invention may be demonstrated by the following experimental results of depositing magnesium fluoride from a tantalum crucible.

Figure 2C:
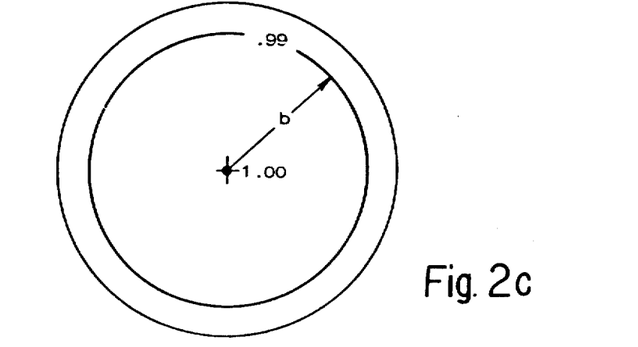

Without a correction mask, the systematic deviation of the radiant intensity within an interval of $\phi = 3°$ to $\phi = 26°$ amounted to plus or minus 10%, with the directional factor of the radiant intensity being expressed approximately by an exponent k=2,3 of the direction cosine. The random deviation of the radiant intensity came to an average of about plus or minus 0.08% during 10 vapor depositions in sequence. With an arrangment in accordance with the invention, in which the cylindrical mask for fine correction has been designed in the last described manner without any additional correction, the systematic deviations of the radiant intensity within the same interval of $\phi$ dropped to less than plus or minus 0.1%. This means a reduction of the systematic deviations to less than 1/100. On the planar substrates $P_1$, $P_2$ as shown in FIG. 1 in full size, a completely uniform coating has been obtained which is indicated by the isolines in FIG. 2c.

The layer profile obtained in the arrangement in accordance with the invention on planar substrates, may be calculated from the formula:

$$s = \frac{1}{2 \cdot (1 + b^2/R_p^2)^{3/2}},$$

where s is the ratio of the layer thickness to the layer thickness at the substrate poles, b is the distance between the surface point and the substrate pole, and $R_p$ is the distance between the substrate pole and the point of intersection of the substrate axes.

For a uniform coating of spherical substrates, the following relations applies:

$$s = \frac{1 - \frac{R + R_p}{R_p} \cdot (1 - \cos\beta)}{\left[ 1 + 2\frac{R}{R_p} \cdot \frac{R + R_p}{R_p} \cdot (1 - \cos\beta) \right]^{3/2}}$$

where $\beta$ is the polar distance of the surface point, and R is the basic radius of curvature of the substrates which, conventionally, is positive for convex substrates and negative for concave substrates.

Surprisingly, an almost even coating is obtained with concave substrates not only if R is minus $R_p$ but also if R is only slightly larger than $R_p/3$. In this latter case, at the polar distance $\beta_1$, which is given by the formula:

$$\cos\beta_1 = 1 -$$

$$\frac{1 - 12R^2/R_p^2 + \sqrt{(1 - 12R^2/R_p^2)^2 - 64(1 + 3R/R_p) \cdot R^3/R_p^3}}{16(1 + R/R_p) \cdot R^3/R_p^3},$$

the layer thickness is exactly equal to that at the substrate poles and increases inwardly while decreasing outwardly. However, 5 to 9 times as many substrates can be placed within the vapor beam cone than in the event of $R = -R_p$. In the open interval between $R = -R_p$ and $R = -R_p/3$, the layer thickness slightly increases with the increasing polar distance $\beta$ which is sometimes desirable, on all other spherical or plane substrates, the thickness decreases. With $R = -2R_p/3$, the increase is at its maximum.

Figure 5:
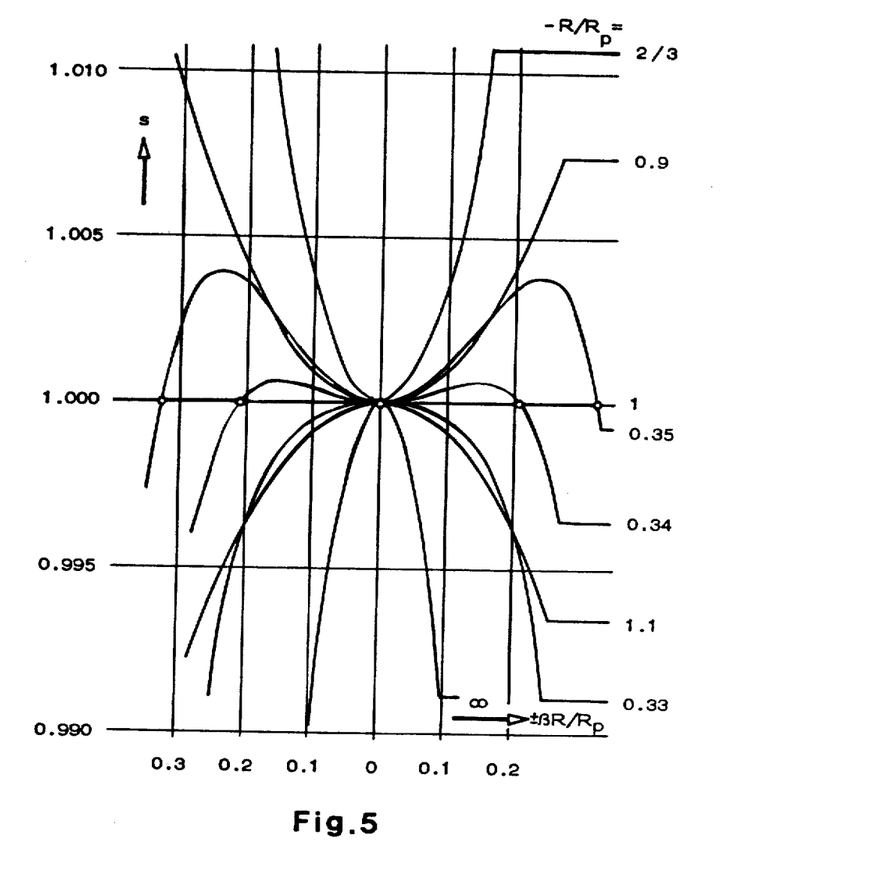
FIG. 5 is a graph illustrating the effects of corrective masks having various shapes.

This is illustrated in FIG. 5 by a plurality of axial sections of uniform coatings of substrates having different basic radii of curvature R. The ratio of basic radius R to the distance $R_p$ from the point of intersection of the substrate axes is indicated at the right hand side. On the X axis, the distances between the surface points and the substrate pole are indicated (expressed by the arc $\beta \cdot R/R_p$) and the ordinates indicate the relative thickness of the layer.

If on the other hand, the objective is to obtain an even coating of spherical substrates of any kind rotating about a common axis $A_0$, the centers of curvatures of all the substrates must coincide with the point of intersection of the substrate apex, i.e., in every instance the basic radii of curvature of the dome and of the corrective masks must be adjusted to the respective substrates.

In spite of eliminating the condition (e) this frequently causes considerable additional expenditures of work and material as compared to the universal arrangement according to the invention which is suitable for coating any surface of revolution, so that a uniformity of the coating will quite readily be preferred. Further, on aspherical surfaces of revolution rotating about a single, common axis, a uniformity can be achieved, but, in principle, an even coating can never be obtained.

The invention can also be applied to substrates which are located in different zone of a sphere.

Pertinent references which will aid in understanding the invention are:

M, Knudsen, Annalen d, Physik 48 (1915) 1113-1121;
K. G. Günther, Z, f. angewandte Physik 9 (1957) 550–556;
K. H. Behrndt, Trans. 10th Vacuum Symposium (1963) 379–384;
U.S. Patent No. 3,598,083 (1969);
B. S. Ramrasad et al., Thin Solid Films 15 (1973) 55–64;
CH-Patentschrift 606 479 (1973);
R. P. Netterfield et al., Applied Optics 13 (1974) 2685–2688;
H. Bollinger et al., Vakuum-Technik 26 (1977) 202–209;
F. Patentschrift 7 704 398 (1977);
D-Offenlegungsschrift 2 815 704 (1978); and
K. Steinfelder et al., Vakuum-Technik 28 (1979) 48–54.

While specific embodiments of the invention have been shown and described in detail to illustrate the application of the principles of the invention, it will be understood that the invention may be embodied otherwise without departing from such principles.

What is claimed is:

1. An apparatus for uniformly coating a number of substrates with surfaces of revolution by vapor deposition in a high-vacuum container by means of at least one evaporative source for producing a vapor stream comprising a structure for supporting all the substrates to be coated which is rotatable about a fixed axis, and at least one corrective mask for intercepting the vapor stream and which also is rotatable about a fixed axis, wherein the apparatus is structured so that:

(a) all substrate axes ($A_1$, $A_2$) intersect at a single point (S);
   (b) all substrate poles ($P_1$, $P_2$) are equidistantly spaced from the point of intersection (S) of the substrate axes;
   (c) an axis of rotation ($A_0$) of the structure supporting the substrates passes through the point of intersection (S) of the substrate axes;
   (d) an axis of rotation of the at least one corrective mask coincides with the axis of rotation ($A_0$) of the structure supporting the substrate, which structure rotates in opposite direction;
   (e) the distance between the evaporative source and the point of intersection (S) of the substrate axes corresponds to less than 15% of the distance between the point of intersection (S) of the substrate axes and the substrate poles ($P_1$, $P_2$);
   (f) the distance between the corrective mask and the substrates corresponds to less than 15% of the distance ($R_p$) between the point of intersection (S) of the substrate axes and the substrate poles ($P_1$, $P_2$); and
   (g) the contour of the at least one corrective mask is determined empirically from the distribution of the vapor radiation in the container space, to the effect that on a spherical surface on which all the substrate poles are located, an even coating is produced.

2. An apparatus according to claim 1, wherein the substrates supporting structure is centrically seated on a rotary ring which is supported on rotatably mounted guide and drive rollers which are mounted at fixed locations with respect to the supporting structure and mask, mounted about axes which intersect at a single point on the axis ($A_0$) of the rotary ring.

3. An apparatus according to claim 1, wherein the at least one corrective mask is secured to a rotary ring which is supported on rotatably mounted guide and drive rollers whose axes intersect at a single point on the axis ($A_0$) of the rotary ring and which are mounted at fixed locations with respect to the at least one mask and supporting structure.

4. An apparatus according to claims 1, 2, or 3 wherein:
   the rotary ring is supported on three guide and drive rollers of which two have an aspherical contour;
   the rotary ring is provided on its underside with a guide groove;
   the rotary ring reposes on each of the two spherically rounded rollers by both side walls of the guide groove; and
   the rotary ring contacts the third roller at a single point.

5. An apparatus according to claim 1, 2 or 3 wherein shafts of the guide and drive rollers extend through a wall (8) of a hopper-shape portion of the high-vacuum container.

6. An apparatus according to claim 1, wherein the at least one corrective mask has a contour which has been determined by an aperture angle $\omega$ and a polar distance $\phi$ of a radius vector L extending from the point of intersection (S) of the substrate axes and defining the outline of the mask, wherein a product of a numerical value of the aperture angle $\omega$ and a numerical value of a radiant intensity $I_0$ of the vapor stream which, with the mask is available from the evaporative source and which depends on the polar distance $\phi$, does not vary within a utilized range of $\phi$, so that the relation $$[\omega]_\phi \cdot [I_0]_\phi = \text{constant},$$

is satisfied.

7. An apparatus according to claim 1, comprising a corrective mask having a contour which is defined by the aperture angle $\omega$ and a polar distance $\phi$ of a radius vector L extending from the point of intersection (S) of the substrate axes and defining the outline of the mask, in accordance with the equation $$\omega = 2\pi \frac{\cos\phi_{max}}{\cos\phi}^k \text{ rad,}$$

wherein $\phi_{max}$ is the upper limit of a utilized interval of $\phi$, and the exponent k is a number greater than zero and less than five.

8. An apparatus according to claim 1, wherein the corrective mask is spherically convex and its center of curvature coincides with the point of intersection (S) of the substrate axes.

9. An apparatus according to claim 1, wherein the corrective mask is cylindrically bent and a cylinder axis Z thereof intersects with the axis of rotation ($A_0$) perpendicularly at the point of intersection (S) of the substrate axes.

10. An apparatus according to claim 9, including a second corrective mask which is spherically convex and its center of curvature coincides with the point of intersection (S) and wherein the spherical and cylindrical corrective masks are at opposite positions and mounted for synchronous rotation about a common axis.

11. An apparatus for a substantially even coating of concave substrates in accordance with claim 1, wherein the distance $R_p$ between the substrate poles ($P_1$, $P_2$) at the point of intersection (S) of the substrate axes is about three times the length of a basic radius of curvature (R) of the substrates.

12. An apparatus for coating concave substrates with the thickness of the coating increasing outwardly, in accordance with claim 18, wherein the distance $R_p$ between the substrate poles ($P_1$, $P_2$) and the point of intersection (S) of the substrate axes is about 3/2 the length of a basic radius of curvature (R) of the substrates.

13. A device for the vapor deposition coating a plurality of substrates in a high-vacuum space comprising:
  an evaporative source for producing a vapor stream of a radiant intensity ($I_0$);
  a substrate support member having a spherical surface for carrying a plurality of substrates and holding the substrates in a position to face said evaporative source, said support member being rotatably mounted about a support member axis which extends through a single selected point (S);
  at least one corrective mask shaped to block at least some of the vapor stream and rotatably mounted about said support member axis, said mask having a contour selected to cause even coating of the vapor stream on the spherical surface of said support member during rotation of said support member and said mask;
  drive means connected to said support member and mask for driving said support member and mask in opposite directions;
  each of the substrates carried on said support member having a substrate axis and substrate pole, with the substrate axis of each substrate intersecting the single selected point and the substrate poles being equidistant from the single selected point;
  the distance between said evaporative source and said single selected point being less than 15% of the distance between said single selected point and each of the substrate poles; and
  the distance between said at least one corrective mask and each substrate being less than 15% of the distance between said single selected point and the substrate poles.

14. A device according to claim 13, including a housing for receiving said evaporative source, a first ring rotatably mounted to said housing and connected to said support member, a second ring rotatably mounted to said housing and connected to said at least one mask.

15. A device according to claim 14, including a plurality of rollers rotatably mounted at fixed locations about said housing for receiving each of said first and second rings.

16. A device according to claim 15, wherein each of said first and second rings includes a groove at the bottom thereof with three rollers engaged in the groove of each of said first and second rings, two of said rollers engaged into each of said rings being substantially spherical in shape for engaging the entirety of each groove and a remaining one of each of said rollers for each of said first and second rings contacting its respective groove and substantially at a point.

17. A device according to claim 14, wherein said at least one corrective mask comprises a substantially triangular mask having one angle adjacent said support member axis and adjacent concave sides connected to a base adjacent a periphery of said substrate support member, said device including a second corrective mask being almond shaped having convex sides with one angle adjacent said support member axis and an opposite angle adjacent the periphery of said support member.

* * * * *